United States Patent
Kudo

(10) Patent No.: US 7,299,973 B2
(45) Date of Patent: *Nov. 27, 2007

(54) SEMICONDUCTOR DEVICE AND AN INFORMATION MANAGEMENT SYSTEM THEREFOR

(75) Inventor: Isao Kudo, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/891,100

(22) Filed: Jul. 15, 2004

(65) Prior Publication Data

US 2004/0256463 A1 Dec. 23, 2004

Related U.S. Application Data

(62) Division of application No. 09/053,040, filed on Apr. 1, 1998, now Pat. No. 6,896,186.

(30) Foreign Application Priority Data

Jun. 27, 1997 (JP) .................................... 9-187535

(51) Int. Cl.
*G06F 17/00* (2006.01)

(52) U.S. Cl. .................. 235/375; 235/383; 235/385

(58) Field of Classification Search ........... 235/375, 235/383, 385, 467, 492, 325, 900, 462.01, 235/462.11, 462.1
See application file for complete search history.

(56) References Cited

U.S. PATENT DOCUMENTS

| | | | |
|---|---|---|---|
| 4,343,877 A | * | 8/1982 | Chiang ..................... 430/5 |
| 4,542,288 A | | 9/1985 | Drexler |
| 4,542,528 A | * | 9/1985 | Sanner et al. ............. 382/318 |
| 4,614,366 A | | 9/1986 | North et al. |
| 4,692,394 A | | 9/1987 | Drexler |
| 4,794,238 A | * | 12/1988 | Hampton ............... 235/462.32 |
| 4,835,376 A | | 5/1989 | Drexler |
| 4,917,292 A | | 4/1990 | Drexler |
| 4,939,354 A | | 7/1990 | Priddy et al. |
| 5,118,369 A | | 6/1992 | Shamir |
| 5,129,974 A | | 7/1992 | Aurenius |
| 5,451,814 A | | 9/1995 | Yoshimizu |
| 5,659,167 A | | 8/1997 | Wang et al. |
| 5,894,172 A | * | 4/1999 | Hyozo et al. ............... 257/797 |
| 6,179,207 B1 | | 1/2001 | Bossen et al. |

(Continued)

FOREIGN PATENT DOCUMENTS

EP 0589732 3/1994

(Continued)

*Primary Examiner*—Karl D. Frech
(74) *Attorney, Agent, or Firm*—Volentine & Whitt, P.L.L.C.

(57) ABSTRACT

According to the present invention, individual two-dimensional barcodes 30, 91 and 173 are provided for individual chips 31 arrayed on a wafer 50, individual lead frames 93 to each of which chips 92 are bonded and individual packaged products 171 constituted of resin sealed semiconductor chips based upon chip ID information to enable information management to be implemented separately for individual chips 31, individual frames 93 and individual chip products 171. Thus, a higher degree of efficiency and a higher degree of accuracy in the information management for semiconductor devices are achieved in all processes of semiconductor production including the individual manufacturing processes, the physical distribution process, the shipping process and the claim handling process.

67 Claims, 16 Drawing Sheets

U.S. PATENT DOCUMENTS

| | | | |
|---|---|---|---|
| 6,476,499 B1 * | 11/2002 | Hikita et al. | 257/777 |
| 6,528,330 B2 * | 3/2003 | Iketani | 438/14 |
| 6,896,186 B2 * | 5/2005 | Kudo | 235/462.11 |

FOREIGN PATENT DOCUMENTS

| JP | 1212429 | 8/1989 |
|---|---|---|
| JP | 4171709 | 6/1992 |
| JP | 4318911 | 11/1992 |
| JP | 4340214 | 11/1992 |
| JP | 05-315207 | 11/1993 |
| JP | 6084730 | 3/1994 |
| JP | 6089962 | 3/1994 |
| JP | 07-022565 | 1/1995 |
| JP | 08-316350 | 11/1996 |
| JP | 3037331 | 2/1997 |

* cited by examiner (a)          (b)

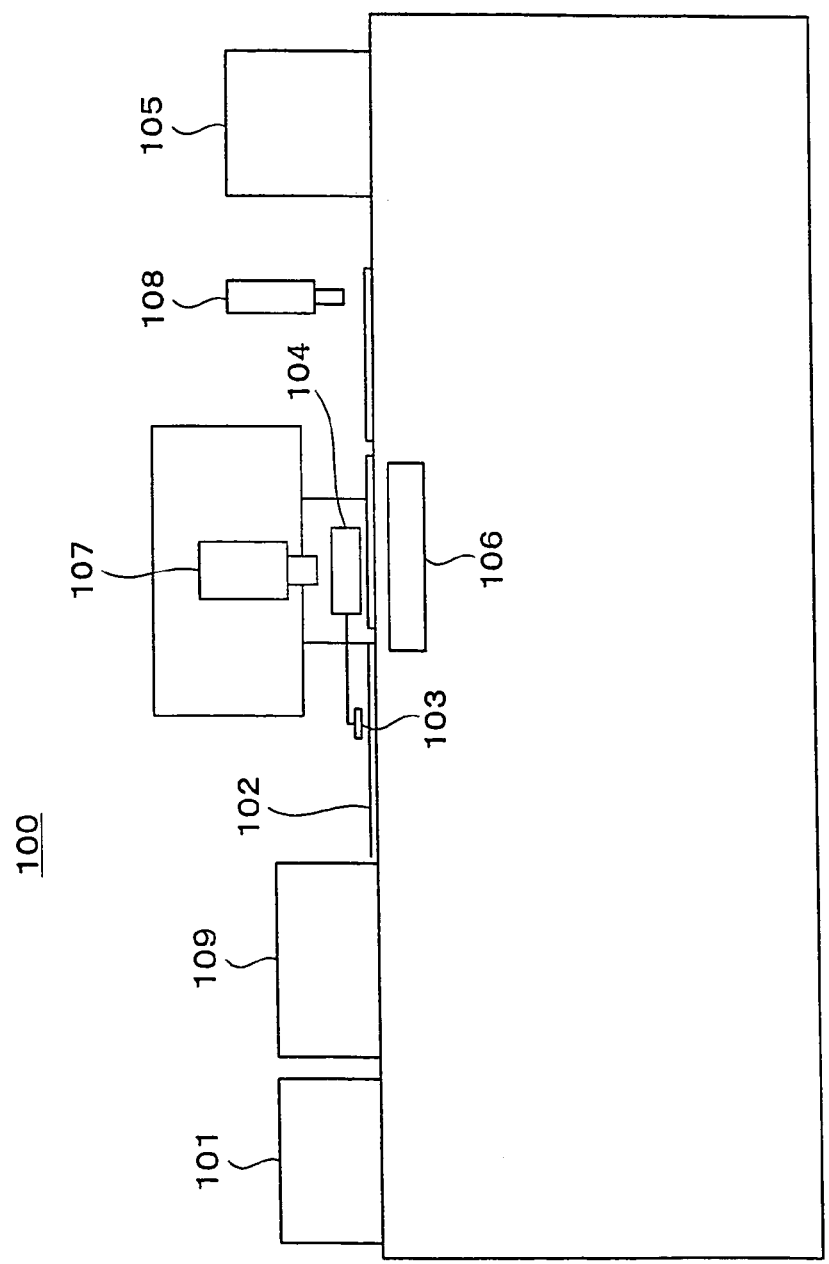

FIG. 12

| chip ID | ***** |
|---|---|
| device type | **** |
| product code | ********* |
| wafer process flow No. | ****** |
| probing category code | ** |

| process | manufacturing conditions | processing date | processing device | collected data |
|---|---|---|---|---|
| die bonding | bonding conditions *** | **** | ** | *** |
| wire bonding | wiring pattern *** | **** | ** | *** |
| ---- | | | | |
| printing | printing pattern *** | **** | ** | *** |
| ---- | | | | |

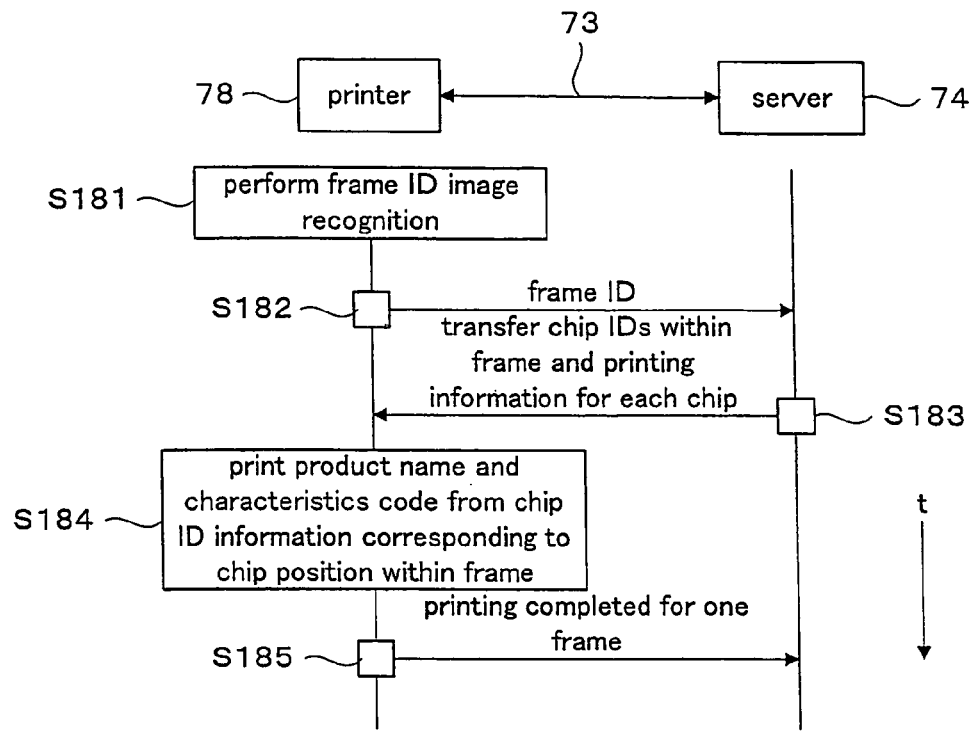
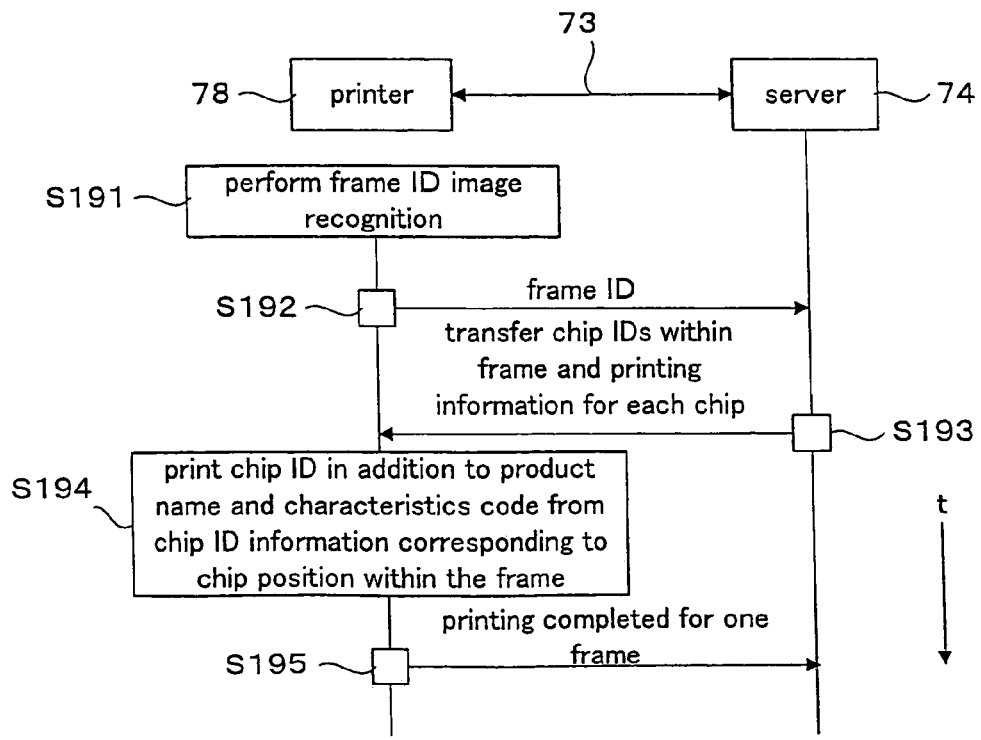

Chip ID information table

SEMICONDUCTOR DEVICE AND AN INFORMATION MANAGEMENT SYSTEM THEREFOR

CROSS REFERENCE TO RELATED APPLICATIONS

This is a divisional application of application Ser. No. 09/053,040, filed Apr. 1, 1998, now U.S. Pat. No. 6,896,186, which is hereby incorporated by reference in its entirety for all purposes.

BACKGROUND OF THE INVENTION

1. Field of the Invention

The present invention relates to a semiconductor device and an information management system for this semiconductor device, and in particular, it relates to a semiconductor device and an information management system therefor that achieve implementation of efficient and accurate information management in regard to the production processes for manufacturing the semiconductor device by utilizing a two-dimensional bar code pattern.

2. Description of the Related Art

A manufacturing method for manufacturing semiconductor devices normally consists of an extremely large number of processes. In a typical manufacturing method for producing semiconductor devices, first, during the wafer processing process, a photolithography step, an etching step, a washing step and the like are performed repeatedly on the surface of the wafer to form the required semiconductor chips. Next, testing for a pass/fail assessment of the individual chips formed on the wafer is performed using a probe apparatus to obtain mapping data, and then it is sent to the wafer assembly process. During the wafer assembly process, first, the wafer is divided into individual dies in a dicing step. Next, good dies are picked up in conformance to the mapping data and are mounted at a lead frame in a bonding step. Then, in a wire bonding step, the connection electrodes and the lead-out terminals for the semiconductor chips are connected through wire bonding. After that, in the packaging process, mold forming is performed on the semiconductor chips using a thermosetting resin and specific information is marked on the surface of the package to complete the semiconductor device.

As explained above, an extremely large number of complicated processes must be implemented to complete the semiconductor device, and it is necessary to implement accurate information management in regard to the information on the semiconductor product in the individual processes. In semiconductor manufacturing methods in the prior art, the management of information on the semiconductor devices as they are distributed throughout the processes is relatively easy since the main focus of the manufacturing methods in the prior art is to mass produce semiconductor devices with the same specifications to take advantage of large scale production. In other words, since, in the semiconductor manufacturing methods in the prior art, semiconductor devices processed through the same manufacturing system are distributed through the processes as one lot unit, each lot is normally processed under the same conditions, making information management relatively easy.

However, in recent years, as semiconductor devices have come to be used widely in general consumer products and industrial parts, great market demand for many different types of semiconductor devices produced in small quantities, such as ASIC (application specific integrated circuits) and SOS (system on silicon) has arisen. Quantity-wise, one wafer may sometimes assure a sufficient quantity to produce a plurality of types of such semiconductor devices for specific applications.

At the same time, there are situations in which products can be shipped as long as a portion of the chips are good, as in the case of large capacity memory chips. Thus, it is necessary to implement information management separately for the individual chips within a given wafer.

For this purpose, in semiconductor manufacturing methods in the prior art, the physical distribution of semiconductor devices throughout various processes is managed by marking ID information, such as numerals and alphabetical characters, on the surface of semiconductor chips on the wafer or on a semiconductor package that is sealed with resin. However, there is a limit to the quantity of information that can be recorded using alphanumeric characters. Furthermore, it is necessary to perform edge recognition processing when reading alphanumeric characters, which is difficult. There is an added problem with this method, in that it is vulnerable to dirt and scarring.

Alternatively, since a read operation can be performed with ease by employing an optical apparatus, various types of information are recorded by utilizing one-dimensional barcode patterns in the inter-process physical distribution of semiconductor devices in some semiconductor manufacturing methods. However, there is a limit to the quantity of information that can be recorded in a one-dimensional barcode pattern per unit area, and since the area occupied by the one-dimensional barcode pattern must increase for a larger quantity of information to be carried, information management using one-dimensional barcode patterns will not always be sufficient in a semiconductor manufacturing method in which semiconductor devices with only limited space available for recording information are handled.

Furthermore, in the prior art, since it is sometimes difficult to make the various types of ID information provided at a semiconductor package correspond to information related to individual chips sealed in the semiconductor package, there is a concern that information management in a semiconductor manufacturing method for producing many different types of products in small quantities cannot be implemented fully.

OBJECTS AND SUMMARY OF THE INVENTION

An object of the present invention, which has been completed by addressing the problems discussed above related to information management implemented for semiconductor devices in the inter-process physical distribution in semiconductor manufacturing methods in the prior art, is to provide a new and improved semiconductor device and an information management system, with which information management can be implemented separately for individual chips arrayed on a wafer, individual lead frames to which semiconductor chips are bonded or individual packaged products of semiconductor chips that are sealed in risen.

Another object of the present invention is to provide a new and improved semiconductor device and an information management system therefor that achieve efficient and accurate inter-process physical distribution in a semiconductor manufacturing processes by recording various types of information in the limited, minute space available on the semiconductor device.

Yet another object of the present invention is to provide a new and improved semiconductor device and an information management system therefor that achieve a higher degree of efficiency and accuracy in the inter-process physical distribution in semiconductor manufacturing processes by making information on individual chips arrayed on a wafer, information on individual lead frames to which semiconductor chips are bonded and information on individual packaged products of semiconductor chips that are sealed in resin correspond to one another.

Yet another object of the present invention is to provide a new and improved semiconductor device and an information management system therefor with which ID information provided on individual chips, individual lead frames and individual packaged chip products can be obtained by employing a relatively inexpensive industrial optical apparatus and highly reliable information can be obtained even when dirt and scarring are present.

Yet another object of the present invention is to provide a new and improved semiconductor device and an information management system therefor with which it is possible to provide improved user service with respect to maintenance work on shipped products by making various types of additional information available, such as production process history information and information on claims made in the field after shipment that can be correlated with the registered product ID information.

In order to achieve the objects stated above, in a first aspect of the present invention, a semiconductor device is provided that is characterized in that a two-dimensional barcode pattern for information management is projected and exposed as chip ID information on each of the chips arrayed on the wafer surface. It is to be noted that since chip ID information is provided in the two-dimensional barcode pattern, it becomes possible to make use of chip information that is inherent to each chip.

Since the quantity of information that can be recorded per unit area of a two-dimensional barcode pattern is very large and recognition utilizing an optical apparatus can be implemented with ease, marking can be made on each of the chips arrayed on the wafer surface, which has not been possible in the prior art, so that information management can be easily implemented for chips on an individual basis.

In addition, as a method for marking a two-dimensional barcode pattern on each chip, projection and exposure may be implemented by employing a liquid crystal mask capable of changing transmitted patterns for different exposures to provide different chip ID information for each wafer using the same mask.

In order to achieve the objects described above, in a second aspect of the present invention, a semiconductor device is provided that is characterized in that marking is implemented with two-dimensional barcode patterns for information management as frame ID information on lead frames to which semiconductor chips are bonded. It is to be noted that in the frame ID information in the two-dimensional barcode pattern, chip positional information indicating the position of chips within the frame and the chip ID information as disclosed in claim 7 may be included.

With this structure, the identification of chip-loaded lead frames which, in the prior art, cannot be visually distinguished from one another, is facilitated and, at the same time, individual chips bonded inside a frame can be distinguished from one another by reading out the frame ID information employing an appropriate optical apparatus.

In order to achieve the objects described above, in a third aspect of the presentation, a semiconductor device that is characterized in that marking for information management is implemented with a two-dimensional barcode pattern as product ID information on the outer surface of a package of resin-sealed semiconductor chips. It is to be noted that in the product ID information recorded in the two-dimensional barcode, additional information and chip ID information corresponding to each of the resin-sealed chips can be included. With this structure, even in a state in which chips cannot be visually checked after molding, information management can be implemented for each chip.

In a fourth aspect of the present invention, an information management system for semiconductor devices that manages information regarding individual semiconductor devices separately is provided. This information management system comprises chip ID information, a read device that reads the chip ID information and a management unit that registers the chip ID information thus read and manages the individual semiconductor manufacturing processes based upon the registered chip ID information. In addition, by managing the chip ID information and the mapping data obtained through probing in correspondence to each other, the occurrence of erroneous pickup operation during die bonding can be reduced.

In a fifth aspect of the present invention, an information management system for semiconductor devices that manages information regarding individual semiconductor devices separately is provided. This information management system comprises frame ID information, a read device that reads the frame ID information and a management unit that registers the frame ID information thus read, and manages the individual semiconductor manufacturing processes based upon the registered frame ID information.

In a sixth aspect of the present invention, an information management system for semiconductor devices that manages information regarding individual semiconductor devices separately is provided. This information management system comprises product ID information, a read device that reads the product ID information and a management unit that registers the product ID information thus read, and manages the product shipment process based upon the registered product ID information.

As explained above, by using the chip ID information, the frame ID information and the product ID information that are coded through two-dimensional barcode patterns in the inter-process physical distribution during the semiconductor manufacturing processes, detailed management can be implemented for individual chips, thereby making it possible to establish a semiconductor manufacturing facility that is capable of supporting production of many different types of products in small quantities with a high degree of flexibility.

It is to be noted that relating the manufacturing process history information on individual chips to the registered product ID information as disclosed in claim 14 or by relating the information on claims made in the field after product shipment to the registered product ID information as disclosed in claim 15, it is possible to pinpoint the cause of any trouble occurring during the semiconductor manufacturing processes to individual chips, and it becomes possible to offer more detailed maintenance service after shipment.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings:

FIG. 10 is a block diagram illustrating the schematic structure of a die bonder that is capable of adding a two-dimensional barcode pattern to a lead time during the bonding step according to the present invention;

FIG. 12 illustrates an example of the information table storing information related to the assembly process conditions, which is prepared in the assembly process information management system according to the present invention;

FIG. 18 is a flowchart illustrating an example of the information referencing/acquisition sequence implemented at the printer in the assembly process information management system shown in FIG. 7;

FIG. 19 is a flowchart illustrating another example of the information referencing/acquisition sequence implemented at the printer in the assembly process information management system shown in FIG. 7;

DETAILED DESCRIPTION OF THE PREFERRED EMBODIMENTS

The following is a detailed explanation of preferred embodiments of the semiconductor device and the information management system therefor according to the present invention in reference to the attached drawings.

Figure 1:
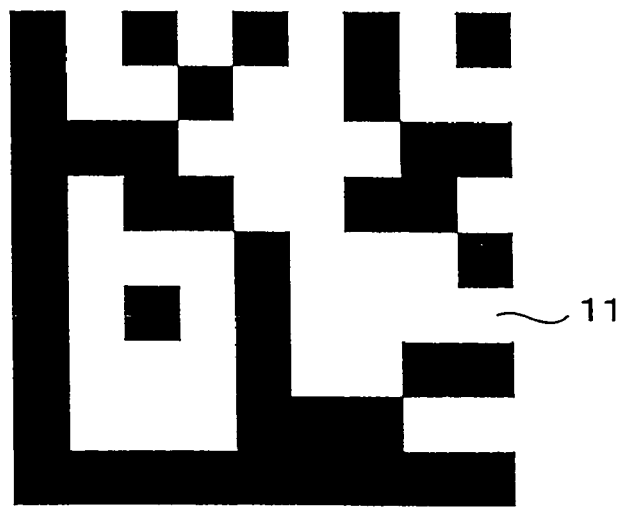
FIG. 1 illustrates a schematic structure of an embodiment of a two-dimensional barcode that may be adopted in the present invention.

First, in FIG. 1, an example of a two-dimensional barcode pattern which may be employed in an embodiment of the present invention is shown. As shown in the figure, a two-dimensional barcode pattern 10 is a two-dimensional pattern in which specific information can be recorded by coloring the squares 11 of a grid in black or white to form blocks that extends two-dimensionally in conformance to predetermined rules. It is to be noted that while the encoding rules for coloring the grid black and white in the two-dimensional pattern may be the same as those in the prior art, new encoding rules may be created instead. A detailed explanation of the actual method for coloring the grid black and white is omitted since it does not bear direct relevance to the contents of the present invention. However, since data error detection can be encoded as part of the encoding rules, and in that case, errors when reading two-dimensional barcode patterns recorded at individual chips, individual frames and individual resin-sealed semiconductor chips can be reduced, as detailed later.

Now, a one-dimensional barcode pattern which is used as a pattern in which various types of information can be recorded in the prior art is explained, in comparison to the two-dimensional barcode pattern adopted in the present invention.

Figure 2:
FIG. 2 illustrates a schematic structure of a one-dimensional barcode in the prior art.

FIG. 2 shows an example of a typical one-dimensional barcode pattern. In the figure, a one-dimensional barcode pattern is constituted of black and white parallel bars 21 having varying widths and a character string 23 constituted of characters in a typeface that can be identified through optical character recognition. However, there is a limit to the quantity of information that can be recorded per unit area of this one-dimensional barcode pattern 20, and since the area occupied by the one-dimensional barcode pattern must increase as the quantity of information that is to be recorded in the one-dimensional barcode pattern increases, a one-dimensional barcode pattern cannot always be used as-is for information management in the semiconductor manufacturing processes in which semiconductor devices with limited available information storage space must be handled.

In contrast, the inventor of the present invention has observed that the two-dimensional barcode pattern adopted in the present invention provide the following superior features compared to the character information patterns and one-dimensional barcode patterns in the prior art.

(1) The quantity of information that can be recorded per unit area is far greater compared to what is possible in a one-dimensional barcode pattern, and since the size of the pattern can be set freely, it is suited to applications in which the available space for the pattern is limited.

(2) The pattern can be formed by employing a simple method, and it is possible to adopt various prior art technologies depending upon where the pattern is to be formed.

(3) Patterns can be identified through optical recognition with ease, and the patterns are not vulnerable to dirt, scars and the like. In addition, they assure a high degree of freedom in regard to the direction of read. Thus, the cost required in relation to the information read device can be minimized.

(4) A code for data error detection can be included in the pattern, and consequently, erroneous pattern reads can be minimized.

The inventor of the present invention has conducted focused research into the features of the two-dimensional barcode patterns described above, which has culminated the completion of the present invention, which achieves efficient and accurate information management in the inter-process physical distribution in the semiconductor manufacturing processes by utilizing two-dimensional barcode patterns at various stages in the semiconductor manufacturing processes.

The following is a detailed explanation of embodiments in which two-dimensional barcodes are used at various stages in the semiconductor manufacturing processes.

1. Embodiment Adopted in the Wafer Process

Figure 3:
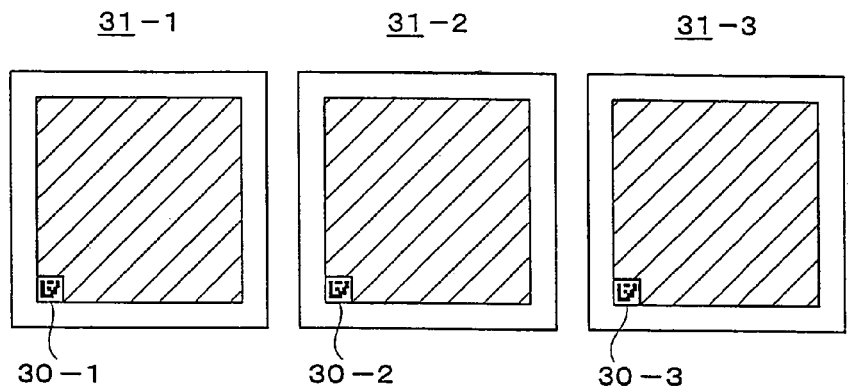
FIG. 3 illustrates an embodiment of a two-dimensional barcode pattern formed on a semiconductor chip according to the present invention.

In this embodiment, in the wafer process, two-dimensional barcode patterns 30 as chip ID information, i.e., two-dimensional barcode patterns 30-1, 30-2 and 30-3, are recorded at specific positions (lower left positions in the figure, for instance) of individual chips. 31-1, 31-2 and 31-3 respectively formed in each wafer, as shown in FIG. 3. The chip ID information may be recorded during the photolithography step for wiring that is implemented near the end of the wafer process, for instance, by projecting and exposing the two-dimensional barcode pattern corresponding to the chip ID information at the specific position of each chip during projection and exposure.

Figure 4:
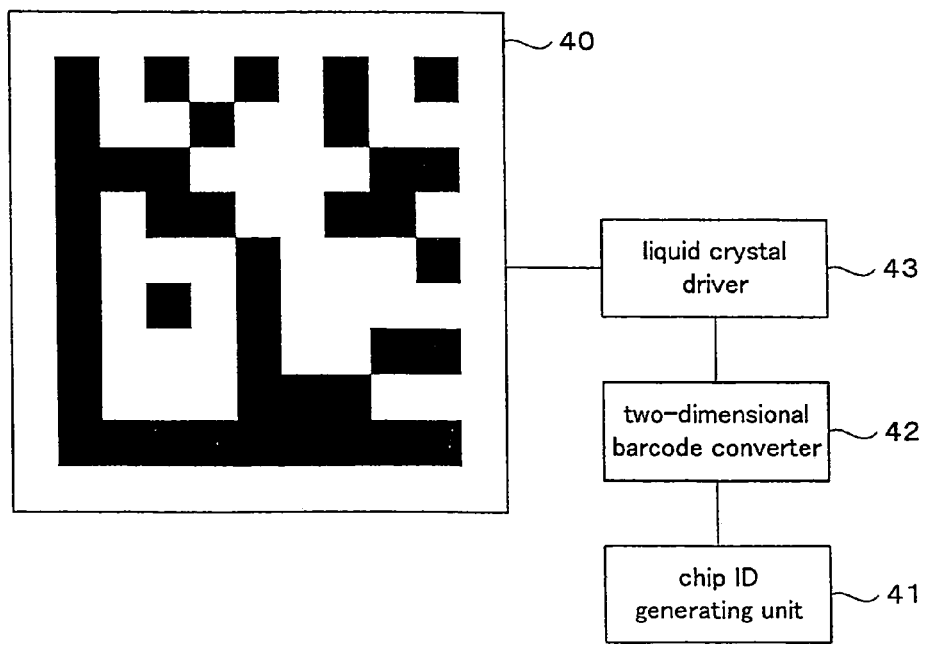
FIG. 4 illustrates an embodiment of the liquid crystal mask employed to project and expose a two-dimensional barcode pattern on a semiconductor chip according to the present invention.

FIG. 4 shows an embodiment of the liquid crystal mask that is employed to project and expose the chip ID information on each chip. This liquid crystal mask 40 is capable of changing the liquid crystal arrangement of the individual grid squares to render a light-transmitting/light-blocking pattern corresponding to the two-dimensional barcode pattern on the mask surface. In a chip ID generating unit 41, chip ID information such as the product name, the lot ID and the chip positional coordinates for each chip is obtained. In a two-dimensional barcode conversion unit 42, the chip ID information transmitted from the chip ID generating unit 41 is converted to a two-dimensional barcode pattern. A liquid crystal driver 43 changes the light transmitting/light blocking pattern in the individual grids formed by the liquid crystal mask 40 as appropriate, and the light transmitting/ light blocking pattern which is converted to a two-dimensional barcode pattern at the two-dimensional barcode conversion unit 42 is rendered on the liquid crystal mask 40 by the liquid crystal driver 43.

Then, by using this liquid crystal mask 40, exposure is performed at a specific position on each chip with a projection exposure apparatus (not shown) to develop a two-dimensional barcode pattern-inherent to each chip. After this, by implementing the photolithography step and the etching step as in normal processing, a two-dimensional barcode pattern inherent to each chip is formed. It is to be noted that while an example in which different two-dimensional barcode patterns are provided for the individual chips is presented above, it goes without saying that a single two-dimensional barcode pattern can be formed for all the chips.

As has been explained, in this embodiment, it is possible to add chip ID information for distinguishing the individual chips in a wafer from one another while taking up an extremely small area on the individual chips of the wafer, and thus, individual chips on a wafer surface can be distinguished from one another, which is not possible in the prior art. In addition, by forming two-dimensional barcode patterns on chips during the wiring step in the wafer process, chip ID information can be recorded for each chip without having to allocate special space for accommodating the two-dimensional barcode pattern. Furthermore, by utilizing the liquid crystal mask 40 shown in FIG. 4 chip ID information that is different for each chip can be recorded using one mask.

2. Embodiment Adopted in the Wafer Assembly Process

Next, an embodiment in which the chip ID information recorded for each chip as described above is utilized in the wafer assembly process of a semiconductor manufacturing method is explained.

Figure 5:
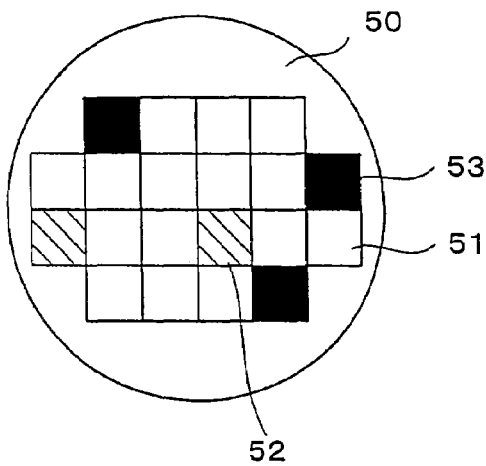
FIG. 5 illustrates an array of chips of varying qualities formed on a wafer.
Figure 6:
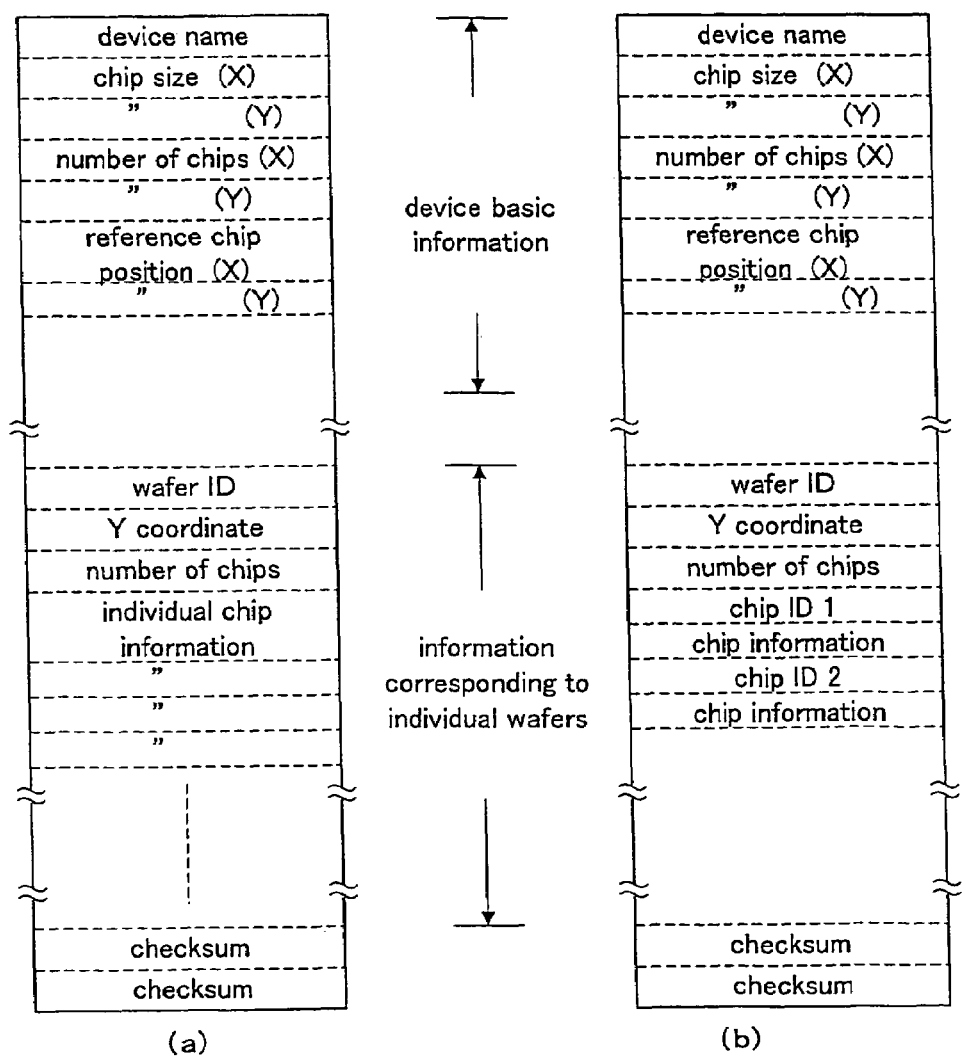
FIG. 6 presents examples of the mapping data tables stored in the data server, with FIG. 6(a) presenting an example of a mapping data table in the prior art and FIG. 6(b) presenting an example of the mapping data table according to the present invention.

Normally, in a semiconductor manufacturing method, pass/fail testing is performed on each chip using a probe apparatus after the chips are formed on each wafer during the wafer process. FIG. 5 shows an example of arrangement of good chips 51 (white squares in FIG. 5), partially good chips 52 (shaded squares in FIG. 5) and defective chips 53 (black squares in FIG. 5) on a wafer 50 inspected in a probing step. The results of the probing test are managed as mapping data, as shown in FIG. 6(*a*). It is to be noted that among the partially good chips 52, there are chips that can be shipped after modification is made in wiring and the like and, as detailed later, in this embodiment, the information, management can be implemented individually for each chip, such partially good chips 52 can be improved into shippable state with ease, thereby achieving an improvement in the product yield.

Figure 7:
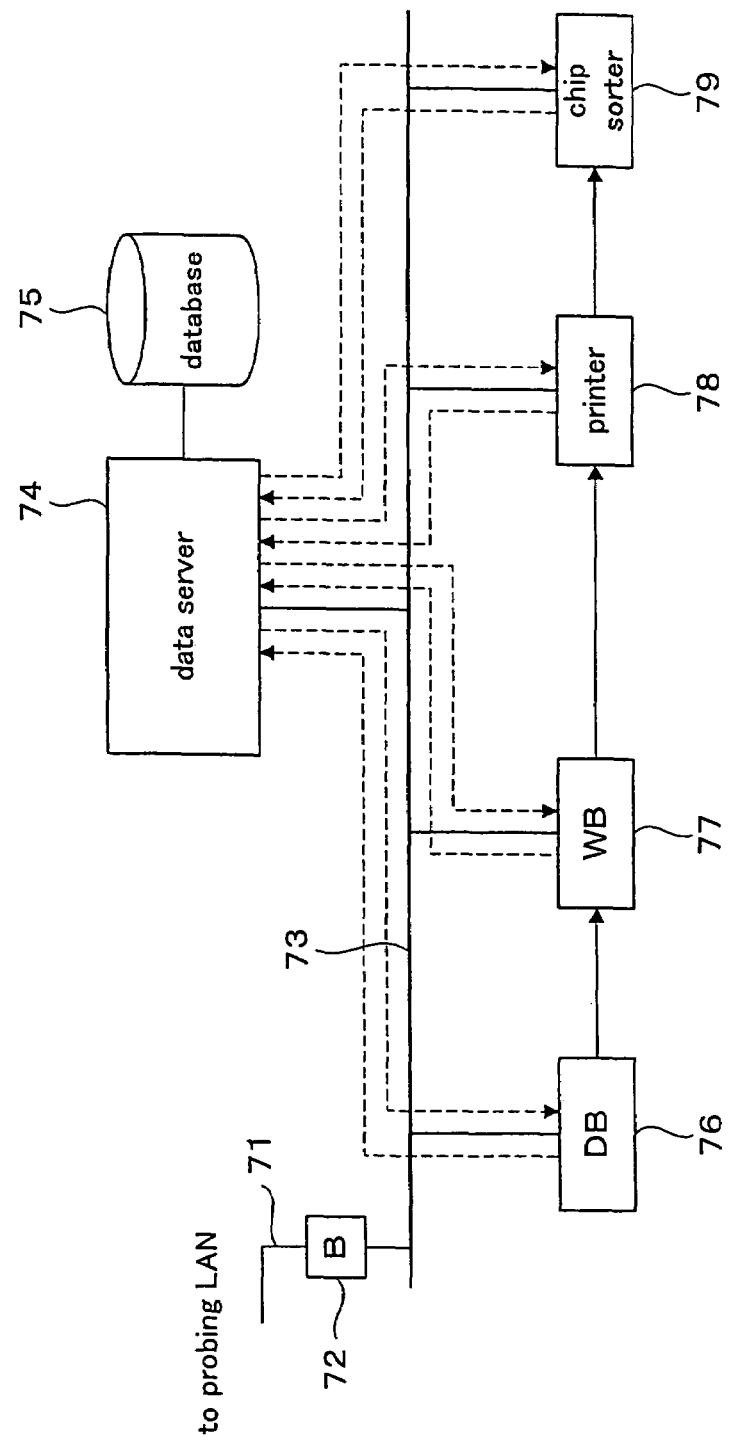
FIG. 7 is a system block diagram illustrating the schematic structure of an assembly process information management system that may adopt the present invention.

FIG. 7 shows a schematic structure of an assembly process information management system 70 which utilizes mapping data including chip ID information inherent to each chip and various types of information tables that are to be detailed later.

As shown in the figure, the information obtained during the probing step is sent to an assembly process LAN 73 from a probing LAN 71 via a bridge 72, and is then stored within a database 75 in a data server 74. The assembly process LAN 73 is connected with semiconductor manufacturing devices that execute the individual assembly steps, such as a die bonder (DB) 76 that picks up chips that have been die cut and mounts them at a lead frame, a wire bonder (WB) 77 that connects electrodes on the chips with lead out terminals through wire bonding, a printer 78 that performs marking on the surface of a package which has been packaged with a thermosetting resin and a chip sorter 79 that sorts chips based upon the information printed on the package.

The following is a detailed explanation of application examples of ID information management according to the present invention, implemented at individual semiconductor manufacturing devices in the chip assembly process.

(A) Embodiment Adopted in the Die Bonder

First, the information management that is implemented at the die bonder (DB) 76 based upon chip ID information corresponding to each chip is explained.

Figure 8:
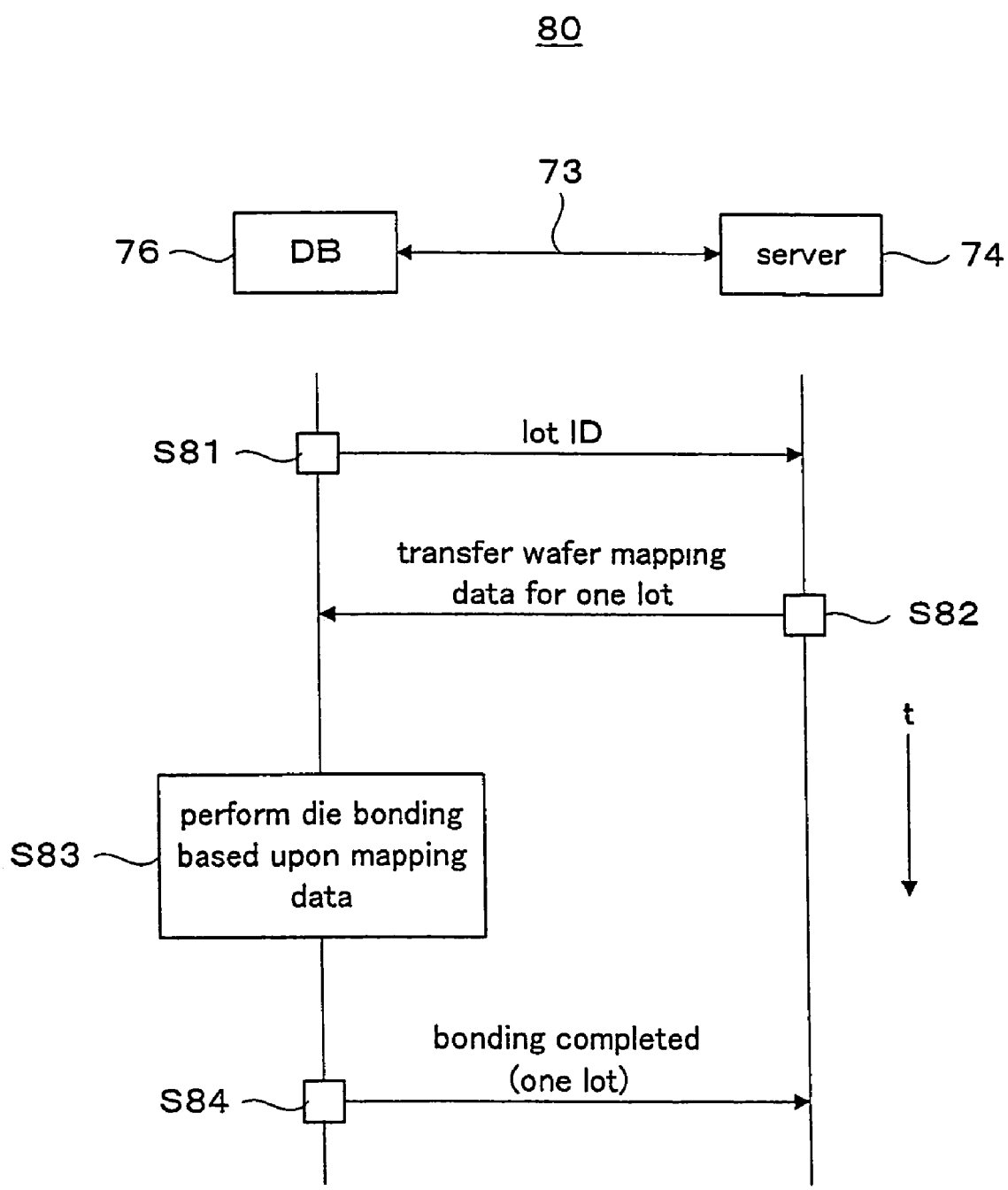
FIG. 8 is a flowchart illustrating the information referencing/acquisition sequence implemented at the die bonder at the assembly process information management system shown in FIG. 7.
Figure 9:
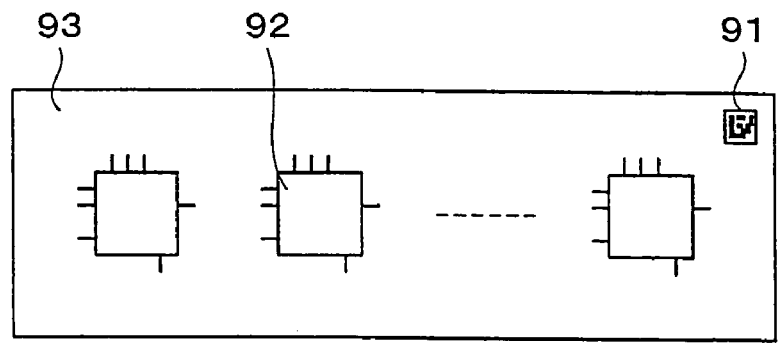
FIG. 9 illustrates an embodiment of a two-dimensional barcode pattern provided on a lead frame to which specific chips are bonded according to the present invention.

In the mapping data fetch sequence 80 shown in FIG. 8, first, the data server 74 is referenced from the die bonder (DB) 76 side for the lot ID of the lot that is to undergo the bonding step (S81). Then, the data server 74 takes out the wafer mapping data (see FIG. 6(b)) related to the referenced lot from the database 75 and transfers them to the die bonder (DB) 76 (S82). At the die bonder (DB) 76, die bonding processing is performed based upon the mapping data thus received (S83). During this die bonding processing, since, in this embodiment, the chip ID information for each chip is made to correspond to the mapping data, as shown in FIG. 6(b), the two-dimensional barcode for each chip can be directly recognized through image recognition when each chip is to be picked up at the die bonder (DB) 76 so that each chip can be referenced with the mapping data. As a result, incidence of erroneous pickup during die bonding can be further reduced. Then, when the bonding processing is completed, an end signal is sent to the server 74 and stored in the database 75 (S84) before the operation proceeds to the next step.

As has been explained, at the die bonder (DB) 76, the chip ID information corresponding to individual chips is directly recognized by using an appropriate optical apparatus during the processing to be referenced against the mapping data by utilizing the chip ID information provided for each chip, unlike in a device in the prior art which only uses the positional information, i.e., the coordinates on the wafer surface. Thus, the rate of occurrence of erroneously picked up chips during die bonding can be reduced.

While an explanation has been given on the utilization of two-dimensional barcode patterns with chip ID information recorded, which are directly marked on the individual chips, frame ID information may be recorded on each frame 93 by providing a two-dimensional barcode pattern 91 on each frame 93 to which individual chips 92 are bonded.

FIG. 10 shows an embodiment of a die bonder which is employed to perform marking of frame ID information on each frame. To describe a schematic structure of the die bonder 100 in the figure, in a wafer ring storage magazine 101, chips are stored in wafer rings 102 before bonding processing, and from the wafer ring storage magazine 101, the required wafer ring 102 is taken out by a delivery arm (not shown) and moved onto a processing stage. A bonding arm 103 removes a chip to be bonded from the wafer ring 102 and places it onto a bonding head unit 104. A lead frame stored in a lead frame storage magazine 105 is supplied by a lead frame supply device 106 to the bonding head unit 104, and the chip is bonded to a specific position on the lead frame. It is to be noted that reference number 107 indicates an image recognition apparatus employed for recognizing the position of the chip to be bonded onto the lead frame and for recognizing the chip ID information provided at the individual chips. When the bonding processing is completed in this manner, the lead frame is moved onto a marking unit where a two-dimensional barcode pattern with frame ID information is printed at a specific position by a frame ID information printing laser device 108, and then it is taken by a delivery arm (not shown) to be stored in the lead frame storage magazine 105. In addition, it is returned into the wafer ring storage magazine 109.

As has been explained, with the two-dimensional barcode pattern 91 inherent to each frame 93 provided by employing the die bonder 100 shown in FIG. 10, lead frames mounted with chips which, in the prior art cannot be visually distinguished from one another by looking at the individual frames, can be identified.

Figure 11:
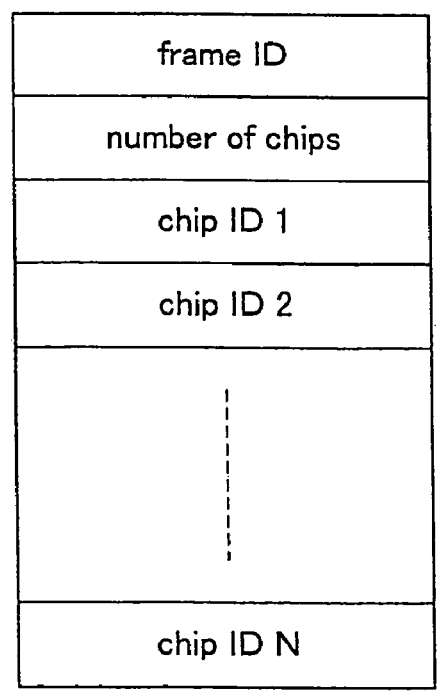
FIG. 11 illustrates an example of the chip information table prepared in regard to lead frames according to the present invention.

Next, an example in which frame ID information is utilized in the chip assembly process information management system shown in FIG. 7 is explained. It is to be noted that FIG. 11 presents an example of the lead frame chip information table that is stored and managed in the database 75 of the data server 74 and, as shown in the figure, in the lead frame chip information table, frame ID information, the number of chips, chip ID information corresponding to individual chips and the like are. recorded, and managed in relation to the two-dimensional barcode patterns on frames and two-dimensional barcode patterns on the individual chips.

In addition, FIG. 12 presents an example of the manufacturing condition information table related to the manufacturing conditions of the individual chips, which is managed at the data server 74. As shown in the figure, in the manufacturing condition information table, types of devices used, the manufacturing conditions, the dates of processing, the processing devices, accumulated data and the like related to individual assembly steps are recorded in addition to the basic data such as individual chip IDs, the-product codes, the flow numbers in the wafer process and the probing category codes, and these data are managed in relation to the two-dimensional barcode patterns on the frames and the two-dimensional barcode patterns on the individual chips.

As has been explained, with the frame ID information and the chip ID information managed in relation to the two-dimensional barcode patterns on the frames and the two-dimensional barcode patterns on individual chips, when referencing is performed by a given manufacturing device in regard to the chip ID information corresponding to the chips bonded to a given frame based upon the frame ID information, the data server 74 searches the information table storing the information related to the frame, and based upon the data recorded in the information table, the data server 74 can respond by returning with the chip ID information corresponding to the chips bonded to the frame, thereby achieving efficient physical distribution management throughout semiconductor device manufacturing processes.

Figure 13:
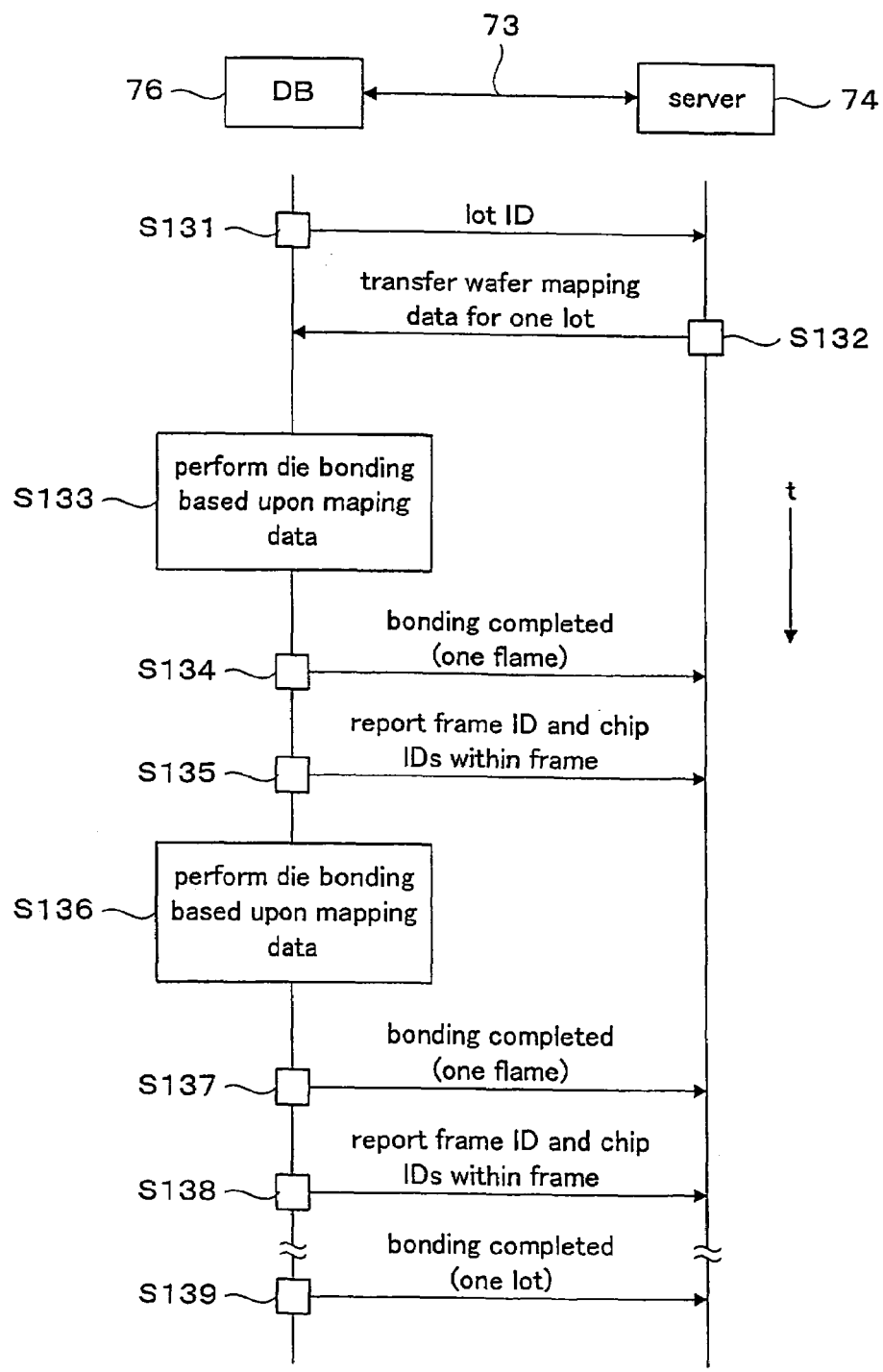
FIG. 13 is a flowchart illustrating another example of the information referencing/acquisition sequence implemented at the die bonder in the assembly process information management system shown in FIG. 7.

Next, in reference to the sequence 130 shown in FIG. 13, yet another example of the information referencing/acquisition processing implemented between the die bonder 76 and the data server 74 is explained.

First, the die bonder (DB) 76 references the data server 74 for the lot ID of the lot that is to undergo the bonding processing (S131). In response, the server 74 takes out the wafer mapping data related to the referenced lot from the database 75 and transfers them to the die bonder (DB) 76 (S132). At the die bonder (DB) 76, the die bonding processing is implemented based upon the received mapping data (S133). During this processing, since the chip ID information on individual chips is made to correspond to the mapping data in the embodiment, when individual chips are picked up by the die bonder (DB) 76, the two-dimensional barcode on each chip can be directly recognized to image recognition so that referencing with the mapping data can be implemented for each chip, which reduces the occurrence of erroneously picked up chips during die bonding.

Then, when the bonding processing for one frame is completed (S134), the die bonder (DB) 76 returns the frame ID information corresponding to the frame on which the processing has been completed and the chip ID information corresponding to the chips that have been bonded to the frame to the data server 74 to update the information tables shown in FIGS. 11 and 12 within the database 75 (S135). Next, the die bonder (DB) 76 implements the bonding processing for the next frame based upon the mapping data (S136), and when the bonding processing on that frame is completed (S137), it returns the frame ID information corresponding to the frame on which the processing has been completed and the chip ID information corresponding to the chips bonded to the frame to the data server 74 to update the information tables within the database 75 (S138). After this, a similar procedure is repeated, and when the bonding processing on the lot information which has been provided by the data-server 74 is completed, the completion thereof is reported to the data server 74 (S139), before proceeding to the next step.

As has been explained, since the information related to individual chips recorded in the information tables in the data server 74 is managed in relation to two-dimensional code patterns recorded at individual chips and two-dimensional code patterns recorded at individual frames in this embodiment, a higher degree of efficiency is achieved in subsequent inter-process physical distribution and a higher degree of accuracy in information management is achieved. For instance, if, in a manufacturing device employed in a subsequent process, the frame ID information can be recognized by employing an appropriate image recognition device, the chip ID information corresponding to the chips bonded to the frame and the manufacturing conditions for individual chips can be obtained from the information tables stored in the data server 74, thereby making it possible to perform accurate processing required for the individual chips.

(B) Embodiment Adopted in the Wire Bonder

Next, as a specific example of utilization of the information described above, an embodiment in which the information table stored in the data server 74 and two-dimensional barcodes recorded at individual chips and individual frames are used during the wire bonding step is explained.

Figure 14:
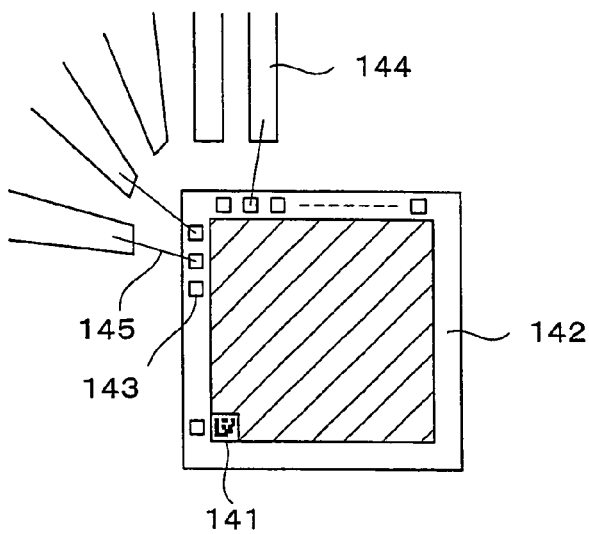
FIG. 14 illustrates wiring bonding pads of chips with leads using a wire bonder.
Figure 15:
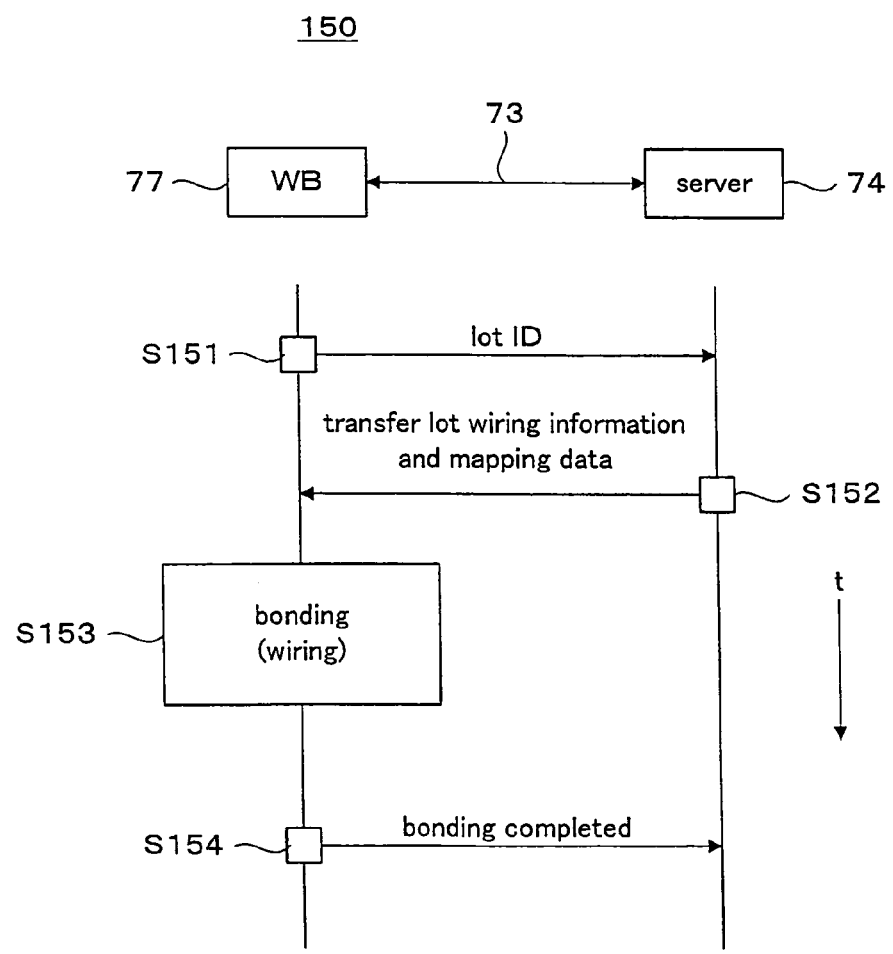
FIG. 15 is a flowchart illustrating an example of the information referencing/acquisition sequence implemented at the wire bonder in the assembly process information management system shown in FIG. 7.

FIG. 14 outlines the wiring implemented between the chips and the leads during a wire bonding step, and in the wire bonding step in this embodiment, the information referencing/acquisition processing sequence 150 illustrated in FIG. 15 is implemented to place wirings 145 between bonding pads 143 positions in the peripheral area of a chip 142 provided with a two dimensional barcode 141 and leads 144, as shown in the figure.

Figure 16:
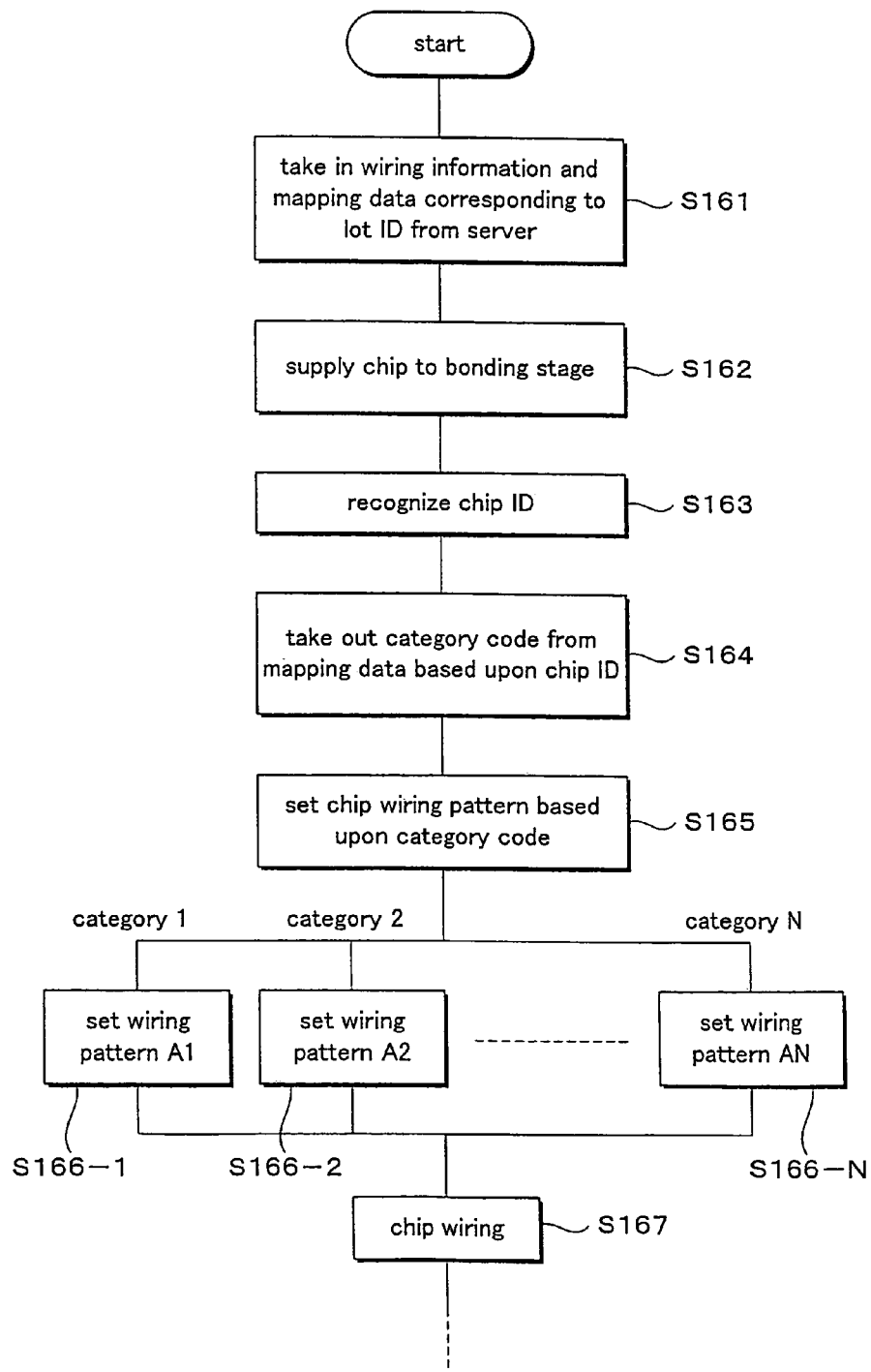
FIG. 16 is a flowchart illustrating the step in which the wire bonding processing is implemented while performing chip ID information recognition, when the present invention is adopted in the bonding step.

Next, in reference to FIGS. 15 and 16, the information referencing/acquisition processing sequence 150 performed during the wire bonding step is explained. First, the data server 74 is referenced by the wire bonder (WB) 77 for the lot ID of the lot to be processed (S151). In response to this referencing, the data server 74 takes out the wiring information on the lot and the mapping data corresponding to the lot from the information table stored in the database 75 and sends them back to the wire bonder (WB) 77 (S152). It is to be noted that in the wiring information corresponding to the lot, the wiring patterns and the category data corresponding to the individual chips are included.

Then, the wire bonder (WB) 77 performs bonding (wiring) processing based upon the received information, and the following is an explanation of the bonding processing performed in this embodiment given in reference to FIG. 16. First, the wire bonder (WB) 77 takes in the product type wiring information and the mapping data based upon the lot ID from the data server 74 (S161), and supplies the relevant chip to the bonding stage (S162). The wire bonder (WB) 77 recognizes the ID information on the frame and the chips by employing an appropriate image recognition apparatus (S163). Then, based on the ID information thus recognized, the corresponding category code is obtained from the mapping data (S164), and in correspondence to the category type, the appropriate wiring pattern is set at the control unit (not shown) inside the bonder (S165, S166-1, S166-2, ..., S16.6-N).

While the good chips 51, the partially good chips 52 and the defective chips 53 are present within the wafer 50, as shown in FIG. 5, among the partially good chips 52, there are products that will become shippable with their wiring patterns modified in a redundance circuit. In that case, in this embodiment, by setting an optimal wiring category based upon the chip ID information individually recognized in correspondence to each chip, those partially good chips 52 can be made into shippable products to improve the yield.

Then, using the wiring coordinates corresponding to the wiring pattern set for each chip, the bonding pad 143 and the lead 144 in each chip 142 are wired (S167). When the specific bonding processing is completed, the wire bonder (WB) 77 reports the completion to the server 74, as shown in FIG. 15 (S154) before the operation proceeds to the next step.

As has been explained, in this embodiment, the ID information corresponding to the individual chips is directly recognized by employing an appropriate image recognition apparatus during wire bonding so that the wire bonding processing can be implemented by modifying the wiring pattern in correspondence to the wiring pattern set for each chip type and the category code set for each chip during probing. As a result, even when wiring patterns are different for individual chips prepared from the same wafer, it is possible to perform bonding processing without having to modify the procedure which is the case in devices in the prior art, thereby achieving a higher degree of efficiency and a higher speed in processing.

(C) Embodiments Adopted in a Printer

Next, embodiments in which the chip ID information and the frame ID information according to the present invention are utilized at the printer 78 in the assembly process information management system shown in FIG. 7 are explained. In this case, too, a higher degree of efficiency in the processing can be achieved, by utilizing the lead frame chip information table (FIG. 11) and the manufacturing condition information table (FIG. 12) stored in the data server 74 in relation to the individual sets of ID information.

Figure 17:
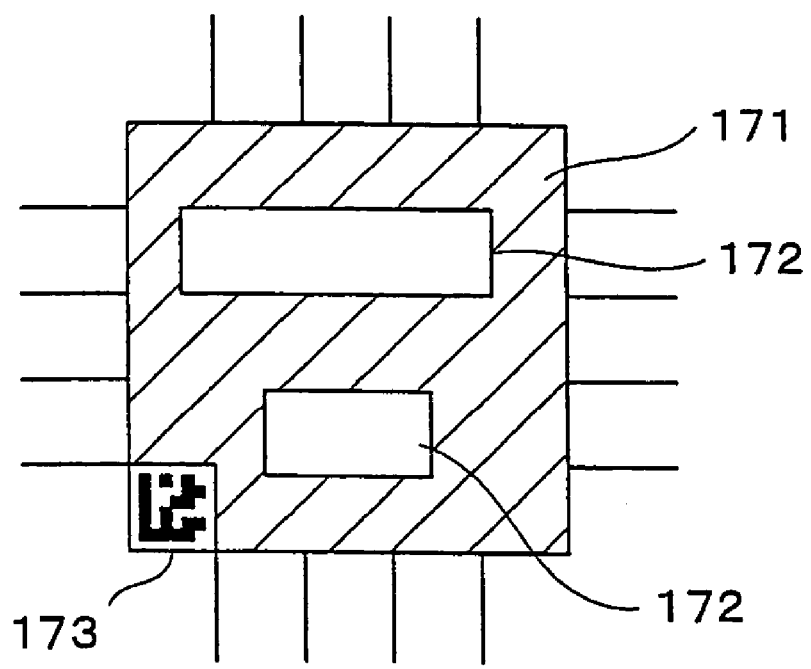
FIG. 17 illustrates a state in which character information and a two-dimensional barcode pattern are printed at the package.

As a first example, the information referencing/acquisition sequence 180 implemented when printing specific information on the package surface of each of the semiconductor devices 171 that are constituted by packaging the semiconductor chips with resin, as shown in FIG. 17, is explained in reference to FIG. 18. First, the printer 78 recognizes the frame ID information that has been printed at an end of each lead frame by a laser device or the like employing an appropriate image recognition apparatus (S181). Next, the data server 74 is referenced by the printer 78 for with the lead frame ID information thus recognized (S182). In response to the referencing, the data server 74 takes out the required information such as the positional information and the ID information in regard to the chips bonded within the lead frame, the printing patterns used on the individual chips, the printed product names and the additional information on the chips, from the information tables stored within the database 75, and transfers the information to the printer 78 (S183). The printer 78 forms a printed pattern each constituted of printed characters 172 (see FIG. 17) indicating the product name, the characteristics code and the like based upon the information thus acquired, and performs printing on the outer surface of the molded package by employing, for instance, a laser device (S184). Then, when printing is completed for one frame, the completion is reported to the server 74 (S185) before the operation shifts to the next step.

As has been explained, in the embodiment illustrated in FIG. 18, since the product names determined for individual chips and the printing of additional information determined in correspondence to the characteristics of the individual chips can be obtained by reading the ID information added to the frame and referencing the data server 74 for information, printing can be performed separately for the individual chips even in a state in which the chips inside cannot be visually checked after molding.

It is to be noted that while in the embodiment illustrated in FIG. 18, specific printing characters are printed based upon the frame ID information and the chip ID information, the present invention is not limited to this example, and the two-dimensional barcode pattern itself, which constitutes the chip ID information corresponding to individual chips, may be printed as printing information. Such an embodiment is now explained in reference to the sequence 190 illustrated in FIG. 19.

First, as in the previous embodiment, the printer 78 recognizes the frame ID information that has been printed at an end of each lead frame by laser device or the like employing an appropriate image recognition apparatus (S191). Next, the data server 74 is referenced by the printer 78 for the lead frame ID information thus recognized (S192). In response to the referencing, the data server 74 takes out the required information such as the positional information and the ID information in regard to the chips bonded within the lead frame, the printing patterns used on the individual chips, the printed product names and the additional information on the chips, from the information tables stored within the database 75, and transfers the information to the printer 78 (S193). The printer 78 forms a printing pattern including the chip ID information 173 in addition to the character information 172 indicating the product name, the characteristics code and the like, as shown in FIG. 19, and performs printing on the outer surface of the molded package by employing, for instance, a laser device (S194). Then, when printing is completed for one frame, the completion is reported to the-server 74-(S195) before the operation shifts to the next step.

As has been explained, in the embodiment illustrated in FIG. 19, since the chip ID information as well as the normal printing information is printed on the package surface, the operator can implement information management for each chip by recognizing the chip ID information using a specific image recognition apparatus and referencing the server 74 for information. In addition, since it is possible to utilize the individual sets of chip ID information as key information in the field, an improvement in the quality of services such as maintenance can be achieved.

(D) Embodiment Adopted in the Chip Sorter

Figure 20:
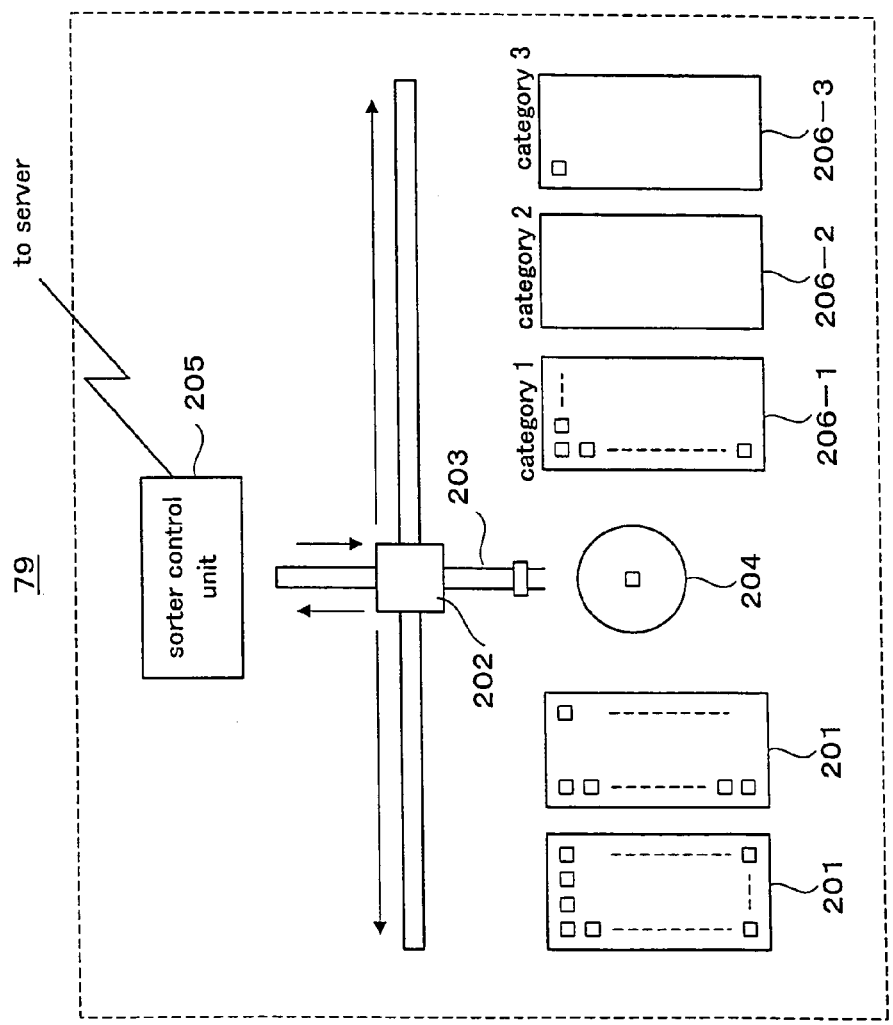
FIG. 20 is a block diagram illustrating a schematic structure of a chip sorter which may adopt the present invention.

FIG. 20 illustrates a schematic structure of the chip sorter 79 that is employed to sort many different types of products produced simultaneously. As shown in the figure, in the chip sorter 79, unsorted chips that are stored in chip storage trays 201 are picked up and re-mounted at an image recognition unit 204 by a chip re-mounting head 203 that is caused to make left and right movements freely by a chip moving unit 202. Then, a sorter control unit 205 recognizes the printed information printed on the chip at the image recognition unit 204, and references the server 74 for the lot ID of the chip thus recognized. In response to the referencing, the server 74 obtains the required information from the information tables and transfers the information to the sorter control unit 205. The sorter control unit 205 performs sorting using the ID information that has been transferred, and selects the relevant storage tray 206-1, 206-2 and 206-3, to sort each chip into one of the selected storage trays 206-1, 206-2 and 206-3.

As has been explained, in the embodiment illustrated in FIG. 20, even when different types of chips within a single frame are manufactured, sorting can be achieved with a given type of chip automatically gathered by recognizing the printed information on the individual chips and referencing the information tables stored in the server 74. It is to be noted that while only the character information printed on the package of each chip may be recognized at the chip sorter to be referenced with the chip ID information stored in the information table, it goes without saying that if the chip ID information is also printed on the package of each chip, sorting can be performed by recognizing a characteristics value of each chip and the like stored in the ID information. In the latter case, since individual chips can be sorted in conformance to the characteristic classifications even with products bearing the same printed information, the sorting operation can be performed very efficiently even when detailed classification is required in correspondence to the access time for products bearing the same product name, as in the case of memory chips.

3. Other Embodiments

While an explanation has been given on application examples in which two-dimensional codes according to the present invention are adopted in the assembly process, the present invention is not limited to these examples, and by managing information tables including the processing history in relation to the chip ID information inherent to individual chips, a higher degree of efficiency can be achieved in the final processes such as the testing process and the physical distribution process implemented after assembly, and even in maintenance work performed after product shipment.

Figure 21:
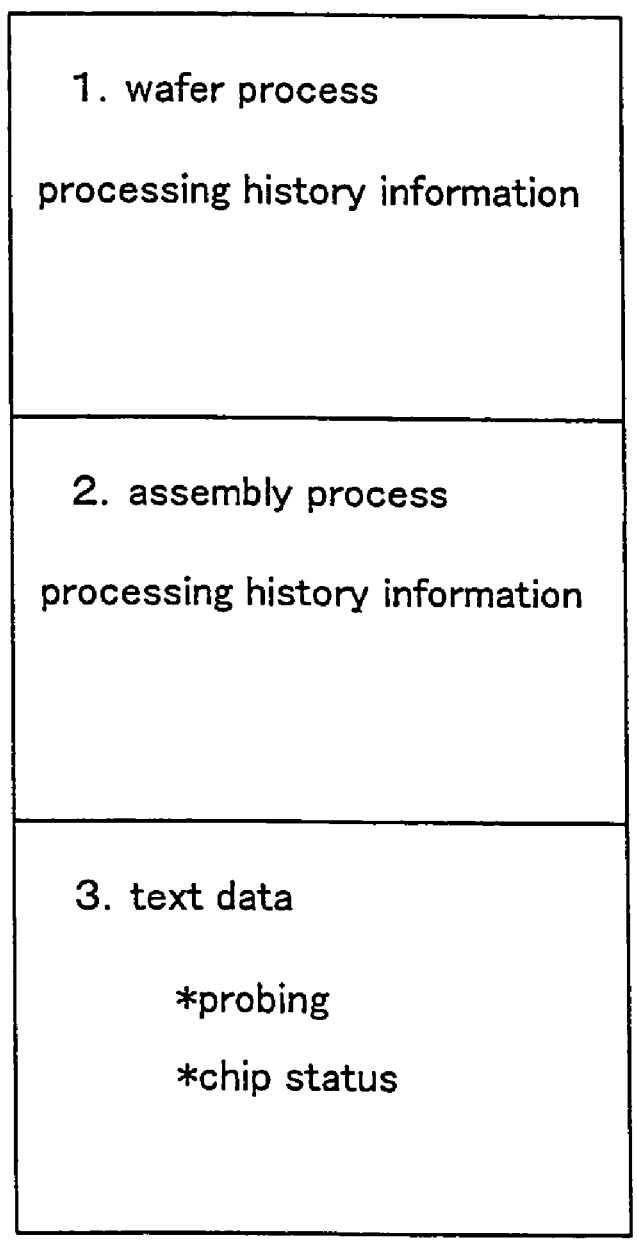
FIG. 21 illustrates an example of the information table in which processing history on each chip is stored according to the present invention.

FIG. 21 shows an example of the information table in which the processing history of each chip is stored to be utilized during the above-mentioned processes or in maintenance work as described above. As shown in the figure, the chip ID information table includes the processing history information corresponding to the wafer process, the processing history information corresponding to the assembly process and the test data acquired during probing and a chip status inspection.

By using this chip ID information table, necessary information can be searched for each chip from the information table that is stored in the database 75 of the data server 74 using the chip ID information as key information. While it is necessary in the prior art to conduct process investigation in units of individual lots if a problem is discovered during a given step in semiconductor production, the range for investigation can be restricted to units of individual chips in this embodiment, thereby achieving a higher efficiency in processing.

Figure 22:
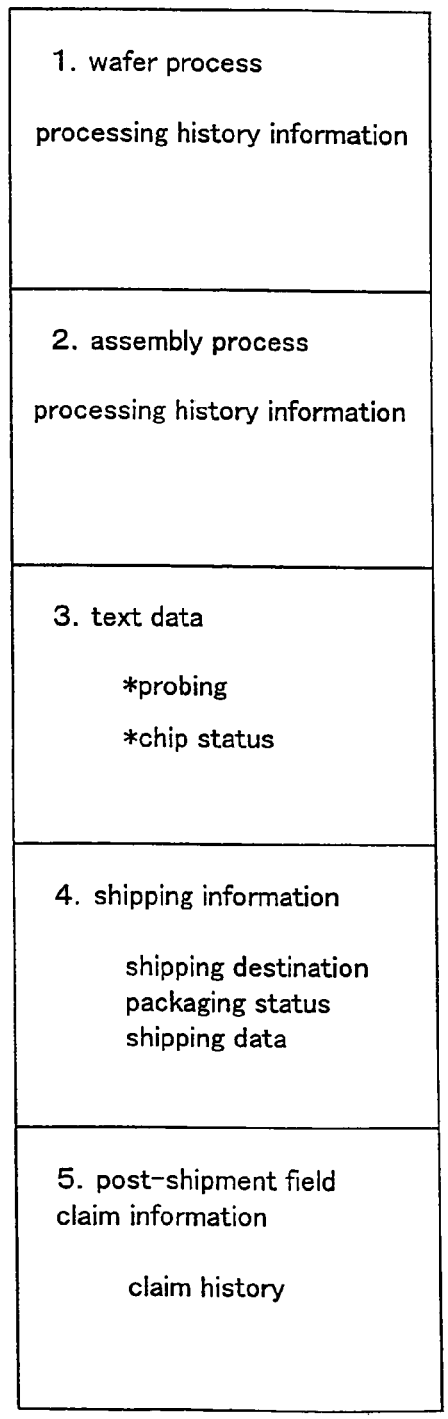
FIG. 22 illustrates an example of the information table constituted by adding shipment information and claim information to the information table shown in FIG. 21.

FIG. 22 shows an-example in which the information table in FIG. 21 is further expanded. In the chip ID information table in the figure, shipping information such as the shipping destination, the packaging form and the date of shipment and post-shipment field claim information such as claim history are provided in addition to the contents of the information table shown in FIG. 21. Shipping information and claim information can be added as necessary to the chip history information table shown in FIG. 22 for updating by utilizing the chip ID information as key information as appropriate in this manner.

By utilizing such a product quality information table, if a claim is made by the user in regard to the quality of delivered semiconductor devices, the processing history during the individual semiconductor manufacturing processes can be referenced, chip ID information corresponding to chips with the same claim can be searched and common factors in the chip group can be analyzed. As a result, the range of investigating for defective chip analysis can be narrowed down, which is not Possible in the prior art, and this is expected to greatly contribute to improving the quality of the semiconductor devices and to quality assurance for the users.

While the semiconductor device and its information management system in the present invention has been particularly shown and described with respect to preferred embodiments thereof by referring to the attached drawings, the present invention is not limited to these examples and it will be understood by those skilled in the art that various changes inform and detail may be made therein without departing from the spirit, scope and teaching of the invention.

As has been explained, according to the present invention, an inherent two-dimensional barcode pattern is provided for each of the chips arrayed on a wafer, each lead frame to which chips are bonded or each packaged product of resin-sealed semiconductor chips based upon chip ID information, to enable information management to be implemented separately for individual chips, individual frames and individual resin sealed product chips. Thus, a-higher degree of efficiency and accuracy in information management for semiconductor devices throughout the processes of semiconductor production such as the individual manufacturing processes, the physical distribution process, the shipping process and the claim handling process, are achieved.

The entire disclosure of Japanese Patent Application No. 9-187535 filed on Jun. 27, 1997 including specification, claims, drawings and summary is incorporated herein by reference in its entirety.

What is claimed is:

1. A semiconductor device comprising:
   a semiconductor chip;
   a plurality of electrodes electrically connected to the semiconductor chip; and
   a package fixing the semiconductor chip and the electrodes, the package having a top surface on which a two-dimensional code pattern and another pattern are marked directly.

2. A semiconductor device according to claim 1, wherein the two-dimensional code pattern includes a plurality of square blocks.

3. A semiconductor device according to claim 1, wherein the package includes a resin material.

4. A semiconductor device according to claim 1, wherein the two-dimensional code pattern includes ID information.

5. A semiconductor device according to claim 4, wherein the ID information include process information.

6. A semiconductor device according to claim 1, wherein the another pattern includes a plurality of characters.

7. A semiconductor device according to claim 6, wherein the characters indicate a product name.

8. A semiconductor device according to claim 1, wherein the two-dimensional code pattern and the another pattern are marked during a same process.

9. A semiconductor device according to claim 1, wherein the another pattern includes characters that indicate a characteristic code.

10. A semiconductor device according to claim 1, wherein the two dimensional code pattern and the another pattern are marked separately.

11. A semiconductor device according to claim 1, wherein the two dimensional code pattern is marked in a corner portion of the top surface of the package.

12. A semiconductor device comprising:
    a semiconductor chip having a surface on which a two-dimensional code pattern and another pattern are marked directly;
    a plurality of electrodes electrically connected to the semiconductor chip; and
    a package fixing the semiconductor chip and the electrodes.

13. A semiconductor device according to claim 12, wherein the two-dimensional code pattern includes a plurality of square blocks.

14. A semiconductor device according to claim 12, wherein the package includes a resin material.

15. A semiconductor device according to claim 12, wherein the two-dimensional code pattern includes ID information.

16. A semiconductor device according to claim 15, wherein the ID information includes process information.

17. A semiconductor device according to claim 12, wherein the another pattern includes a plurality of characters.

18. A semiconductor device according to claim 17, wherein the characters indicate a product name.

19. A semiconductor device according to claim 12, wherein the two-dimensional code pattern and the another pattern are marked during a same process.

20. A semiconductor device according to claim 12, wherein the another pattern includes characters that indicate a characteristic code.

21. A semiconductor device according to claim 12, wherein the two dimensional code pattern and the another pattern are marked separately.

22. A semiconductor device according to claim 12, wherein the two dimensional code pattern is marked in a corner portion of the surface of the semiconductor package.

23. A semiconductor device comprising:
    a semiconductor chip;
    a plurality of electrodes electrically connected to the semiconductor chip; and
    a package fixing the semiconductor chip and the electrodes, the package having a top surface on which a two-dimensional code pattern and another pattern are printed directly.

24. A semiconductor device according to claim 23, wherein the two-dimensional code pattern includes a plurality of square blocks.

25. A semiconductor device according to claim 23, wherein the package includes a resin material.

26. A semiconductor device according to claim 23, wherein the two-dimensional code pattern includes ID information.

27. A semiconductor device according to claim 26, wherein the ID information includes process information.

28. A semiconductor device according to claim 23, wherein the another pattern includes a plurality of characters.

29. A semiconductor device according to claim 28, wherein the characters indicate a product name.

30. A semiconductor device according to claim 23, wherein the two-dimensional code pattern and the another pattern are marked during a same process.

31. A semiconductor device according to claim 23, wherein the another pattern includes characters that indicate a characteristic code.

32. A semiconductor device according to claim 23, wherein the two dimensional code pattern and the another pattern are marked separately.

33. A semiconductor device according to claim 23, wherein the two dimensional code pattern is marked in a corner portion of the top surface of the package.

34. A semiconductor device comprising:
a semiconductor chip having a surface on which a two dimensional code pattern and another pattern are printed directly;
a plurality of electrodes electrically connected to the semiconductor chip; and
a package fixing the semiconductor chip and the electrodes.

35. A semiconductor device according to claim 34, wherein the two-dimensional code pattern includes a plurality of square blocks.

36. A semiconductor device according to claim 34, wherein the package includes a resin material.

37. A semiconductor device according to claim 34, wherein the two-dimensional code pattern includes ID information.

38. A semiconductor device according to claim 37, wherein the ID information includes process information.

39. A semiconductor device according to claim 34, wherein the another pattern includes a plurality of characters.

40. A semiconductor device according to claim 39, wherein the characters indicate a product name.

41. A semiconductor device according to claim 34, wherein the two-dimensional code pattern and the another pattern are marked during a same process.

42. A semiconductor device according to claim 34, wherein the another pattern includes characters that indicate a characteristic code.

43. A semiconductor device according to claim 34, wherein the two dimensional code pattern and the another pattern are marked separately.

44. A semiconductor device according to claim 34, wherein the two dimensional code pattern is marked in a corner portion of the surface of the semiconductor chip.

45. A semiconductor device comprising:
a semiconductor chip;
a plurality of electrodes electrically connected to the semiconductor chip; and
a package fixing the semiconductor chip and the electrodes, the package having a top surface on which a first pattern including a two-dimensional code pattern and a second pattern are marked directly.

46. A semiconductor device according to claim 45, wherein the two-dimensional code pattern includes a plurality of square blocks.

47. A semiconductor device according to claim 45, wherein the package includes a resin material.

48. A semiconductor device according to claim 45, wherein the two-dimensional code pattern includes ID information.

49. A semiconductor device according to claim 48, wherein the ID information includes process information.

50. A semiconductor device according to claim 45, wherein the second pattern includes a plurality of characters.

51. A semiconductor device according to claim 50, wherein the characters indicate a product name.

52. A semiconductor device according to claim 50, wherein the characters indicate a characteristic code.

53. A semiconductor device according to claim 45, wherein the first and second patterns are marked during a same process.

54. A semiconductor device according to claim 45, wherein the first pattern and the second pattern are marked separately.

55. A semiconductor device according to claim 45, wherein the first pattern is marked in a corner portion of the top surface of the package.

56. A semiconductor device comprising:
a semiconductor chip having a surface on which a first pattern including a two-dimensional code pattern and a second pattern are marked directly;
a plurality of electrodes electrically connected to the semiconductor chip; and
a package fixing the semiconductor chip and the electrodes.

57. A semiconductor device according to claim 56, wherein the two-dimensional code pattern includes a plurality of square blocks.

58. A semiconductor device according to claim 56, wherein the package includes a resin material.

59. A semiconductor device according to claim 56, wherein the two-dimensional code pattern includes ID information.

60. A semiconductor device according to claim 59, wherein the ID information includes process information.

61. A semiconductor device according to claim 56, wherein the second pattern includes a plurality of characters.

62. A semiconductor device according to claim 61, wherein the characters indicate a product name.

63. A semiconductor device according to claim 61, wherein the characters indicate a characteristic code.

64. A semiconductor device according to claim 56, wherein the first and second patterns are marked during a same process.

65. A semiconductor device according to claim 56, wherein the first pattern is marked in a corner portion of the surface of the semiconductor chip.

66. A semiconductor device according to claim 56, wherein the first pattern and the second pattern are marked separately.

67. A semiconductor device according to claim 56, wherein the first pattern is marked in a corner portion of a top surface of the package.

* * * * *